United States Patent [19]

Brice et al.

[11] 4,187,139
[45] Feb. 5, 1980

[54] GROWTH OF SINGLE CRYSTAL BISMUTH SILICON OXIDE

[75] Inventors: John C. Brice; Owen F. Hill; Ronald G. Pratt, all of Salfords near Redill, England

[73] Assignee: U.S. Philips Corporation, New York, N.Y.

[21] Appl. No.: 805,539

[22] Filed: Jun. 10, 1977

Related U.S. Application Data

[63] Continuation of Ser. No. 673,406, Apr. 5, 1976, abandoned, which is a continuation of Ser. No. 441,585, Feb. 11, 1974, abandoned.

[30] Foreign Application Priority Data

Feb. 14, 1973 [GB] United Kingdom ............... 7224/73

[51] Int. Cl.$^2$ .................. B01J 17/18; C01G 29/00
[52] U.S. Cl. .................. 156/600; 156/617 SP; 156/624; 156/DIG. 79; 423/326; 422/249
[58] Field of Search ............... 156/DIG. 79, 617 SP, 156/616, 624, 600; 423/326, 87, 88; 422/249

[56] References Cited

U.S. PATENT DOCUMENTS

| | | | |
|---|---|---|---|
| 3,418,086 | 12/1968 | Loiacono | 156/624 |
| 3,653,814 | 4/1972 | Bonner | 156/617 |
| 3,723,599 | 3/1973 | Brandle | 156/617 |
| 3,883,313 | 5/1975 | Cullen | 156/617 |

FOREIGN PATENT DOCUMENTS 2122768 1/1972 France ..................... 156/617 SP

OTHER PUBLICATIONS

Chemical Abstracts, "Rez", vol. 74, #20, 1971, p. 364, Abstract #105,156m.

Primary Examiner—S. J. Emery
Attorney, Agent, or Firm—Norman N. Spain

[57] ABSTRACT

Method of growing single crystal of bismuth silicon oxide from a melt of $Bi_x Si O_{1.5x+2}$, in an oxygen containing atmosphere. At the start of crystallization, x has a value of 11.55 to 11.82 or 12.35 to 14.00. The value of x does not have a spread of more than 0.025 throughout the crystal.

2 Claims, 1 Drawing Figure

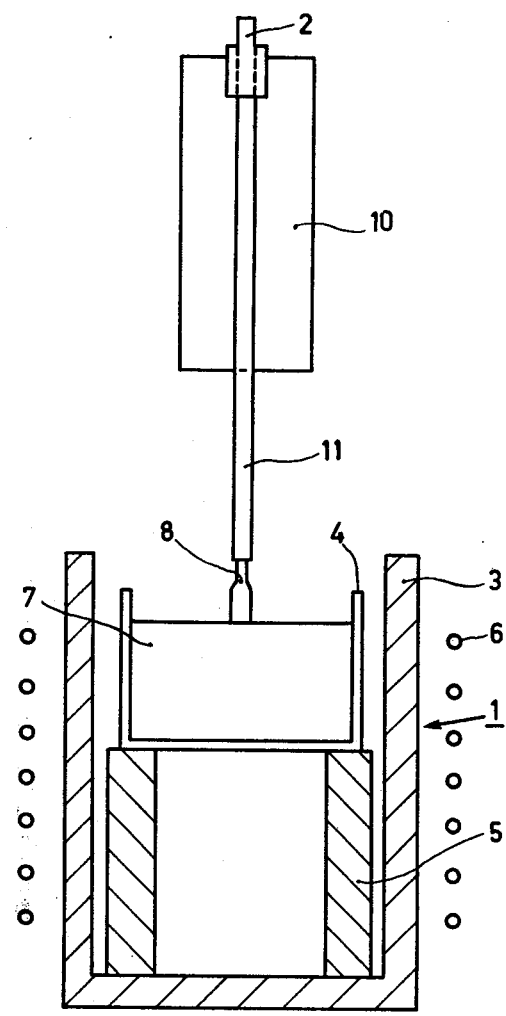

GROWTH OF SINGLE CRYSTAL BISMUTH SILICON OXIDE

This is a continuation of application Ser. No. 673,406, filed Apr. 5, 1976, and now abandoned. Said application Ser. No. 637,406 in turn being a continuation of application Ser. No. 441,585 filed Feb. 11, 1974 and now abandoned.

This invention relates to a method of growing a single crystal of bismuth silicon oxide, to a single-crystal grown by such a method, and to devices containing such single crystals, which devices use the piezoelectric or electro-optic properties of the crystals, for example in acoustic surface wave devices or optical memories.

Single crystals of bismuth silicon oxide having a composition defined by the formula $Bi_{12}SiO_{20}$ have been grown and have been found to be piezoelectric. Electro-mechanical coupling constants of these crystals on random crystal orientations and geometrics have been found to be 0.30.

It is known that the composition of a single crystal of a mixed oxide can vary within the crystal. Crystals which are crudely described as having a composition defined by the formula $Bi_{12}SiO_{20}$ are better described as having a composition $Bi_xSiO_{1.5x+2}$. If a crystal is grown from a melt, the composition of the crystal is a function of the composition of the melt and of the growth conditions. Variations of the growth rate, for example, cause variations in the composition along the length of the crystal, but it is difficult to avoid all changes in growth rate. For many applications it is desirable that the composition of a single crystal should be substantially constant along the length of the crystal, both on account of the greater tendency of non-homogeneous crystals to crack during cutting or polishing operations and for the requirement of producing crystal elements having physical properties within narrow ranges of values. During the investigations which led to the present invention, it was found that it was possible to grow single crystals of bismuth silicon oxide having essentially constant composition throughout the length of the crystal provided the initial composition of a melt from which the single crystal was grown had a composition in one of two ranges.

The present invention provides a method of growing a single crystal of bismuth silicon oxide of constant composition as hereinbefore defined, wherein the crystal is grown in an atmosphere comprising free oxygen from a melt of $Bi_xSiO_{1.5x+2}$ in which x initially has a value in the range from 11.55 to 11.82 or from 12.35 to 14.00. The expression "constant composition" is used throughout this specification to indicate that the value of x does not have a spread of more than 0.025 throughout the crystal. It is probable that 0.025 is the smallest detectable change in x at this level of x in such a crystal. When melts having compositions defined by the above ranges of x are used, 25% of the melt can be used to grow a single crystal of constant composition. When it is desired to use 50% of the melt to grow a single crystal of constant composition, x must be from 11.60 to 11.80 or from 12.75 to 13.50. In order to use 75% of the melt to grow a single crystal of constant composition, the initial value of x in the melt must be from 11.65 to 11.78 or from 12.75 to 13.00. It has been found that the crystals grown from melts having initial compositions defined by values of x in the above-defined ranges have less tendency to crack than do crystals grown from melts having initial compositions defined by values of x outside these ranges.

The single crystals may be grown by any method used to grow crystals from a melt, for example floating zone, Bridgman or Czochralski methods, and the atmosphere, for example, may consist of oxygen or of air.

Crystal elements cut from these single crystals may be used to form the piezoelectric surface wave element in a wave-filter, for example a wave-filter as described in our co-pending application no. 45801/69.

A few embodiments of the present invention will now be described with reference to the drawing, in which:

FIG. 1 schematically shows a crystal growth assembly used to grow a single crystal of $Bi_xSiO_{1.5x+2}$ by the Czochralski method.

The apparatus contained a growth assembly 1 which was contained in a stainless steel water-cooled growth chamber (not shown) which was connected to a crystal puller 2. The growth assembly 1 consisted of a magnesia crucible 3 and a platinum crucible 4 which was supported by a zirconia tube 5 resting on the bottom of the crucible 3. The platinum crucible 4 was heated by an eddy current heater coil 6 supplied from a 30 Kw eddy current heater (not shown). The output of the eddy current heater was stabilised by a PHILIPS (Trade Mark) 1653 controller and this made it possible to control the temperature of a melt 7 in the platinum crucible 4 to within ±0.2° C.

A melt of bismuth silicon oxide having a composition specified in the Table below, was prepared by melting together $Bi_2O_3$ (Johnson Matthey grade I) and $SiO_2$ (Johnson Matthey grade I), in an oxygen atmosphere.

The melt 7 weighed 150 gms and was contained in a platinum crucible 4 which was 35 mm in diameter and 35 mm high, and which had a wall thickness of 1 mm. A crucible base temperature in the range from 940°–950° C. was used. A seed 8 was used which was aligned parallel to a <1 0> crystallographic axis. A crystal 9 was pulled at 4.5 mm per hour and was rotated at a rate between 25 and 45 r.p.m. This method produced crystals weighing approximately 50 gms and which had diameters of 10 to 15 mm. These crystals were not annealed before use.

When larger crystals were needed, the conditions had to be modified. Crystals having diameters of 20–25 mm and weighing up to 500 gms were grown from a melt 7 which weighed 700 gms and was contained in a platinum crucible 4 which was 50 mm in diameter, 60 mm high and had a wall thickness of 1.5 mm. The seeds used were parallel to either the <100> or <110> axes. The temperature of the base of the crucible 4 during growth was between 920° and 930° C., the rate of growth was between 2 and 3 mm per hour and the crystal was rotated at about 12 r.p.m. When the crystal 9 had grown to the desired size, the diameter of the crystal was reduced to zero, the angle at the apex of the cone preferably being less than 90°. The crystal was then slowly raised until it was entirely within a tubular alumina heat shield 10 which was coaxial with the stem 11 of the crystal puller 2, and then the crucible temperature was slowly reduced at such a rate that the crystal was cooled at a rate of less than 1° C. per minute. The tubular heat shield 10 is sealed at the top to the crystal puller so that the tube does not serve as a chimney.

Crystals having a diameter of more than 20 mms may be annealed at 850° C. for 48 hours, but it is important that the crystal should be heated or cooled at a rate of less than 1° C. per minute.

It was found that when growing crystals by the Czochralski method, that the growth rate should not exceed 6 mm per hour (at higher rates second phase inclusions are found in the crystals), and the rate of rotation should be less than 15 r.p.m. for crystals over 35 mm in diameter (at greater rates of rotation a convective instability in the melt makes controlled growth impossible).

The following conditions were found for crystals grown from two different melt compositions.

TABLE.

| Melt | | Crystal | |
|---|---|---|---|
| x at start of growth | weight % $SiO_2$ | x at start of growth | change in x after 1Δ of melt used up. |
| 11.6 | 1.605 | 11.8 | 0.0 |
| 13.0 | 1.435 | 12.0 | 0.0 |

Optical examination showed that the crystals were optically active and rotated plane polarised light by approximately 21° per mm of sample. The crystals showed no signs of strain birefringence.

It was found that the value of $k_1^2$ for these crystals was 0.018±8%, where $k_1$ is the electromechanical coupling coefficient for acoustic surface waves on (001) planes in a <110> direction. The value of $k_2^2$ for these crystals was 0.022±8%, where $k_2$ is the electromechanical coupling coefficient for acoustic surface waves on (111) planes in a <110> direction. The phase velocity of acoustic surface waves on (001) planes in a <110> direction is approximately 1.7 km/sec. Lithium niobate has a phase velocity of acoustic surface waves on v-planes in a z-propagating direction of 3.5 km/sec. Thus it is possible to use considerably smaller transducers to obtain a given delay when using a bismuth silicon oxide crystal instead of a lithium niobate crystal as the delay medium.

It was found that the phase velocity of acoustic surface waves of crystals made by the method according to the invention was reproducible to within ±0.1% between different crystals. The variations of the phase velocity of acoustic surface waves with temperature over the range 0°–70° C. was 115±5 p.p.m./°C. both for waves on (001) planes in a <110> direction and on (111) planes in a <110> direction.

What is claimed is:

1. In the method of growing a single crystal of bismuth silicon oxide of constant composition by crystalization from a melt of bismuth silicon oxide the improvement wherein the crystallization is carried out in an oxygen containing atmosphere from a melt of $Bi_xSiO_{1.5x+2}$ wherein at the start of the crystallization x has a value of 11.55 to 11.82 or of 12.35 to 14.00 such that the value of x does not have a spread of more than 0.025 throughout the crystal.

2. The method of claim 1 wherein the oxygen containing atmosphere is air.

* * * * *